(12) United States Patent
Hollis

(10) Patent No.: US 7,492,287 B2
(45) Date of Patent: Feb. 17, 2009

(54) TWO-BIT TRI-LEVEL FORCED TRANSITION ENCODING

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/752,800

(22) Filed: May 23, 2007

(65) Prior Publication Data

US 2008/0291063 A1    Nov. 27, 2008

(51) Int. Cl.
*H03M 5/16* (2006.01)
(52) U.S. Cl. .......................................... 341/57; 341/68
(58) Field of Classification Search .................. 341/50, 341/58, 59, 68, 69
See application file for complete search history.

(56) References Cited

U.S. PATENT DOCUMENTS

| | | | | |
|---|---|---|---|---|
| 3,302,193 A | * | 1/1967 | Sipress | 341/57 |
| 3,418,631 A | * | 12/1968 | Sipress et al. | 714/810 |
| 4,910,750 A | * | 3/1990 | Fisher | 375/292 |
| 5,754,566 A | * | 5/1998 | Christopherson et al. | 714/773 |
| 7,000,040 B2 | * | 2/2006 | Senuma | 710/100 |
| 2004/0062319 A1 | | 4/2004 | Casper et al. | |

OTHER PUBLICATIONS http://www.interfacebus.com/Definitions.html (Copyright 1998-2006).
http://www.cs.wustl.edu/~jain/cse473-05/ftp/i_5cod2.pdf (2005).
http://www.seas.gwu.edu/~jstanton/courses/cs184/lectures/lec11-2004-datalink.pdf (2004).

* cited by examiner

*Primary Examiner*—Peguy JeanPierre
(74) *Attorney, Agent, or Firm*—Wong Cabello Lutsch, Rutherford & Brucculeri, LLP

(57) ABSTRACT

An encoding technique is disclosed for mitigating against the effects of Intersymbol Interference (ISI) and DC creep by forcing data transitions at least every two data bits. Two consecutive bits of data in the original non-return-to-zero (NRZ) data stream are grouped and are converted by an encoding circuit into two new consecutive data bits of the same duration as the original bits. The new encoded bits in each group will necessarily transition between two of three possible data states, and specifically will transition between '−1' and '0' logic states, or '+1' and '0' logic states. Pursuant to this encoding scheme, no more than two consecutive encoded bits will ever be of the same logic state, which prevents any particular data state from predominating and causing DC creep.

24 Claims, 8 Drawing Sheets

```
                            25
                          ↙

Original (NRZ)              Encoded
     bits                     bits
─────────────              ─────────

0  0      ──────▶        0   +1

0  1      ──────▶       -1    0

1  0      ──────▶        0   -1

1  1      ──────▶       +1    0
```

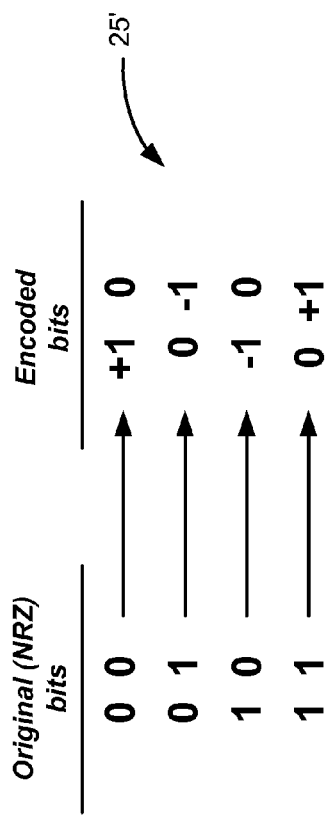
*Figure 6A*
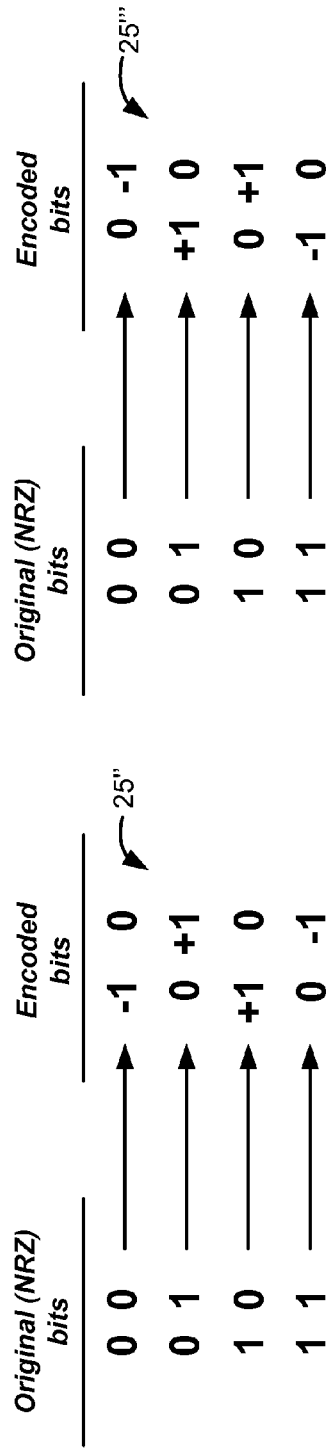
*Figure 6B*
*Figure 6C*

TWO-BIT TRI-LEVEL FORCED TRANSITION ENCODING

FIELD OF THE INVENTION

Embodiments of this invention relate to a technique for encoding data for transfer across a lossy or bandwidth-limited transmission channel.

BACKGROUND

It is a common practice to employ forms of data encoding to facilitate data transfer in a communication system 10, such as shown in FIG. 1. A transmitter (Xmit) 12 sends data along a channel 16 to a receiver (Rcvr) 14. In one example, the transmitter 12 and receiver 14 may comprise integrated circuit components, while channel 16 comprises a signal trace on a printed circuit board that supports those components. As shown, within the transmitter 12, the data 11 to be transferred is sent to an encoder 13, where it is modified into a new format presumably better suited for transmission through the channel 16. Once the encoded data is received at the receiver 14, it is sent to a decoder 15, which essentially removes the formatting to once again recover the original data 11. The recovered data 11 may then be applied to some useful end by a functional circuit 18 within the receiver 14. System 10 may comprise, for example a Synchronous Dynamic Random Access Memory (SDRAM), in which the receiver 14 comprises an SDRAM integrated circuit and the transmitter 12 comprises a microprocessor or a memory controller 12. Of course, in such an implementation many channels 16 would be present and operate in parallel, but this is not shown for convenience. However, the transmitter 12 and receiver 14 can comprise any type of integrated circuits, or even functional blocks on the same integrated circuit for example.

There are many different ways in which data may be encoded prior to transmission, and several previous methods are illustrated in FIG. 2. Starting at the top of FIG. 2 is an exemplary data stream of '1s' and '0s,' corresponding to the un-encoded data 11 of FIG. 1. This data 11, as shown, comprises a non-return-to-zero (NRZ) signal, which for all intents and purposes comprises a "normal" time varying digital data signal in need of encoding, in which a logic '1' state comprises a high voltage (e.g., Vcc, typically the operating voltage of the transmitter 12) and a logic '0' state comprises a low voltage (e.g., GND).

The first encoding method shown in FIG. 2 comprises return-to-zero (RZ) encoding, in which the latter half of each data bit necessarily returns to zero. The next illustrated encoding method comprises bipolar non-return-to-zero (Bi-NRZ) encoding, which basically level shifts the voltage of the logic '0' bits to a logic '−1' state (e.g., −Vcc), such that the resulting signal is bipolar, varying from −Vcc to +Vcc. The next illustrated method comprises bipolar return-to-zero (Bi-RZ) encoding, which essentially comprises a combination of the previously-illustrated RZ and Bi-NRZ encoding methods, in which a bipolar signal returns to zero (e.g., GND) during the latter half of each data bit.

Manchester encoding, the next illustrated method, converts each data bit to a logic transition. Specifically, a logic '1' bit is converted to a low-to-high ('0'-to-'1') transition, while a logic '0' bit is converted to a high-to-low ('1'-to-'0') transition. Finally, the last illustrated method shown, 4-PAM (Pulse Amplitude Modulation) encoding, assesses two sequential bits and encodes them into a single pulse having one of four potential amplitudes. These amplitudes can be equally spaced between ground and Vcc (e.g., GND, +⅓Vcc, +⅔Vcc, and Vcc), which for convenience can be respectively referred to as logic states '0,' '1,' '2,' and '3.'

These previous encoding approaches were designed to achieve various benefits; however, it is not particularly interesting to this disclosure to review such benefits in detail. Instead, what is important to understand is the effect that these previous encoding methods have on intersymbol interference (ISI). As one skilled in the art understands, ISI results when a pulse becomes dispersed while traveling down a bandwidth-limited transmission line, such as channel 16 in FIG. 1. This dispersion results from a combination of non-uniform group delay (different frequency components within the pulse propagating at distinct speeds and arriving at different points in time at the receiver) and the high frequency signal loss incurred as the bandwidth of the data to be transmitted exceeds the physical bandwidth of the transmission channel 16. As the data rate approaches or exceeds the bandwidth limit of the channel, the dispersion becomes worse, with the result that a given data pulse has the potential to perturb prior and subsequent pulses.

FIG. 3 illustrates the effects of ISI on an un-encoded (NRZ signal), and particularly shows the problem of DC creep resulting from ISI. Shown is an ideal signal 20 as would be sent from the transmitter 12. The transmission of this ideal signal 20 was simulated as passing through a channel 16 with a specified transfer function essentially mimicking that of a lossy and bandwidth-limited trace on a typical printed circuit board. Because frequency components within the ideal signal 20 are approaching the frequency limit of the channel 16, it can be seen that the resulting signal 22 is "smeared" and does not well represent the ideal signal 20. Obviously, such a poor representation of the data reduces the sensing margins at the receiver 14.

DC creep makes sensing further difficult. As one skilled in the art understands, DC creep tends to draw ISI-affected signals higher or lower in potential over time. Whether the average signal level creeps up or down depends on the predominant logic states within the signal: if the signal contains a predominant number of '0s', the average signal level will creep downward; and if the signal contains a predominant number of '1s,' the bias average signal level will creep upward. Creep in both directions is noticeable in FIG. 3. Because the first half of the ideal signal 20 contains mostly '0s,' the resulting signal 22 during that period tends to creep to lower DC levels. By contrast, the second half of the ideal signal 20 contains mostly '1s,' and so it is seen that the resulting signal 22 creeps towards higher DC levels. As noted, this problem of creep further exacerbates sensing. If it is assumed that a single threshold voltage (Vt) is used to sense the data at the receiver, creep will eventually cause some '1s' to be erroneously sensed as '0s' (see, e.g., points 24a), and some '0s' to be erroneously sensed as '1s' (see, e.g., point 24b).

As data frequencies continue to increase, problems resulting from ISI and DC creep become significant, and so it is worthwhile to consider to what extent the previous encoding schemes of FIG. 2 are useful in protecting against such effects. In this regard, it can be noticed immediately that three of the illustrated encoding techniques (RZ; Bi-RZ; and Manchester) result in an effective doubling of the frequency, because the encoded bits are half the duration of the original NRZ bits. Because ISI results from the problem that even the baseline NRZ signal is of too high a frequency for the channel 16, it is obvious that encoding techniques that increase the frequency of the signal will only make matters worse, and are not preferred as a means for mitigating such problems. Manchester encoding is somewhat of an exception in that the DC balanced nature of Manchester encoded data tends to suppress DC creep. However, the doubling of the associated circuitry bandwidth is still problematic, and as such, Manchester has been avoided in multi-Gigabit/second systems.

Another technique, Bi-NRZ, does not change the frequency content of the signal when compared to the normal NRZ signal. However, it requires operation at negative voltages, which increases system complexity, while doing nothing to mitigate ISI or DC creep.

Finally, the 4-PAM technique would mitigate against the effects of ISI because it cuts the effective frequency in half by doubling the duration of the encoded bits. However, such benefits are largely overshadowed by a concomitant increase in sensing complexity. Specifically, because of the four voltage levels for the encoded signals (e.g., GND, +⅓Vcc, +⅔Vcc, and Vcc), at least three voltage thresholds must be used to sense these levels (e.g., +⅙Vcc, +½Vcc, and +⅚Vcc). Because the magnitudes of data signals are also decreasing as technology progresses, the requirement to sense voltages of such fine gradations is difficult, especially at appropriate speeds. In short, the 4-PAM technique essentially trades off one sensing problem (ISI) for another (reducing voltage margins), and is not preferred as an encoding technique for mitigating against the effects of ISI in modern-day high-frequency digital signals.

With the foregoing understood, it should be evident that the art would be benefited by an improved data encoding technique useful in mitigating ISI and DC creep in high-speed data transmissions, but without significant associated drawbacks. This disclosure provides such a solution.

BRIEF DESCRIPTION OF THE DRAWINGS

FIG. 4A illustrates the encoding affected by the 2-bit tri-level forced transition encoding scheme of the invention, while

FIGS. 6A-6C illustrate alternative embodiments of the encoding scheme of FIG. 4A.

DETAILED DESCRIPTION

In brief summary, the disclosed encoding technique mitigates against the effects of Intersymbol Interference (ISI) and DC creep by forcing data transitions at least every two data bits. Two consecutive bits of data in the original non-return-to-zero (NRZ) data stream are grouped and are converted by an encoding circuit into two new consecutive data bits of the same duration as the original bits. The new encoded bits in each group will necessarily transition between two of three possible data states, and specifically will transition between '−1' and '0' logic states, or '+1' and '0' logic states. Pursuant to this encoding scheme, no more than two consecutive encoded bits will ever be of the same logic state, which prevents any particular data state from predominating and causing DC creep.

Figure 4A:
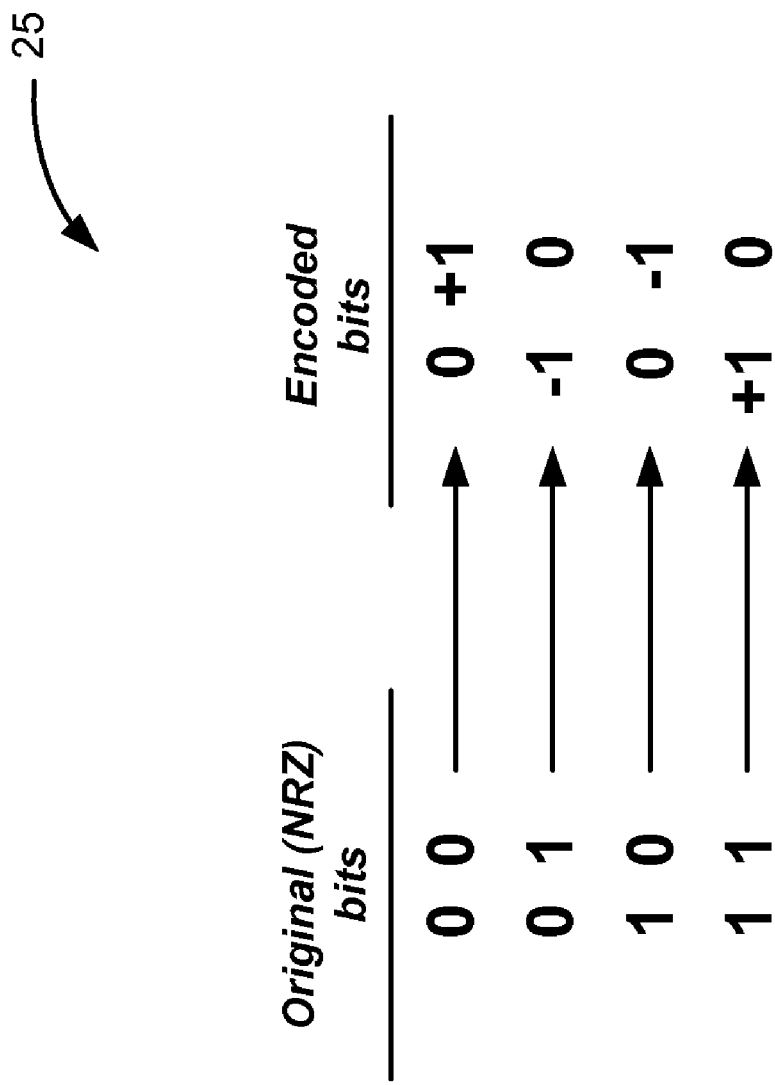

The disclosed data encoding technique 25 is illustrated in one embodiment in FIG. 4A. As shown, the encoding technique 25 maps two consecutive original (NRZ) data bits to two new encoded data bits. Specifically, consecutive original bits '0 0' are mapped to '0 +1 '; '0 1' are mapped to '−1 0'; '1 0' are mapped to '0 −1'; and '1 1' are mapped to '+1 0'.

Figure 2:
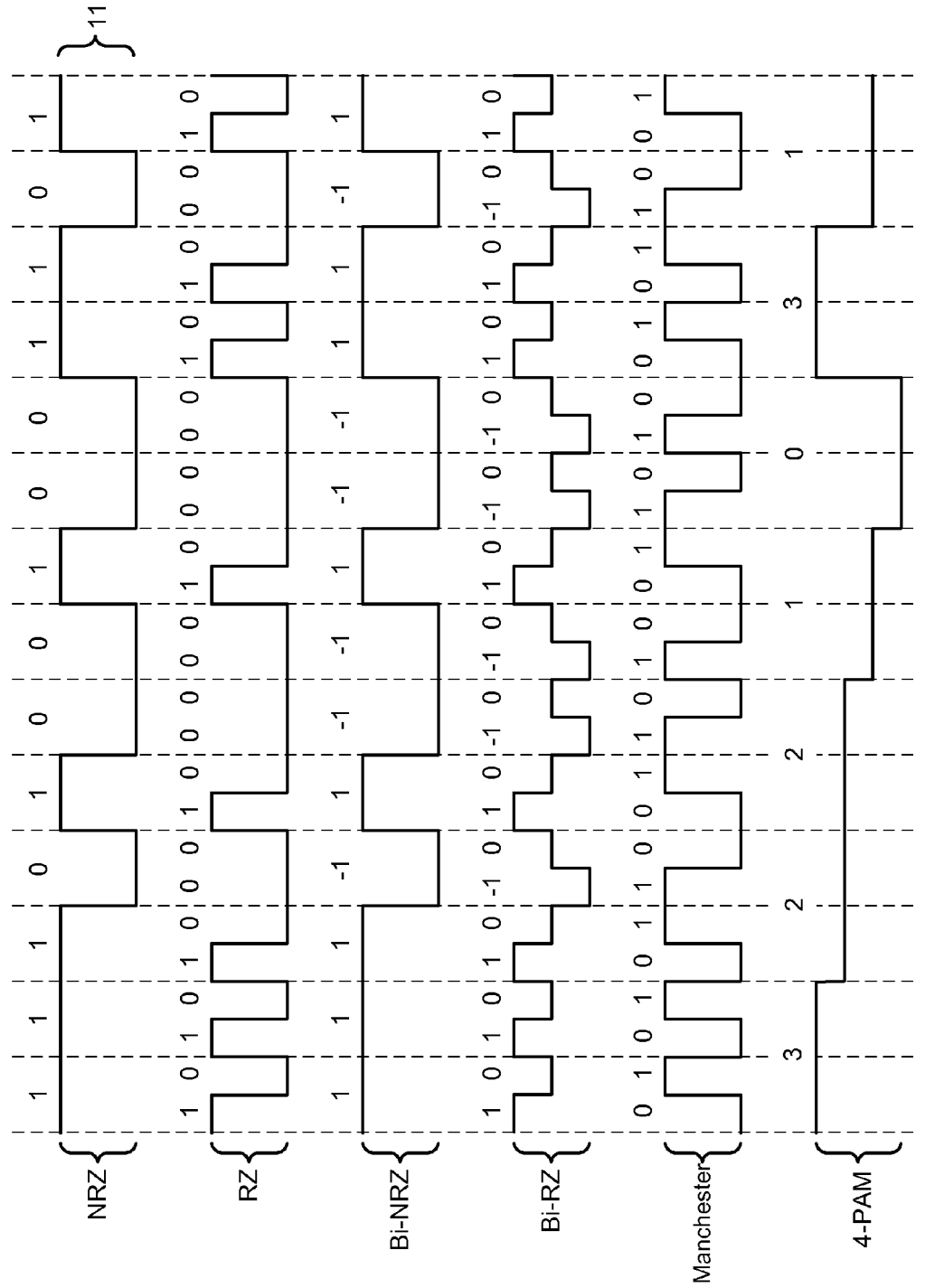
FIG. 2 illustrates several previous data encoding schemes useable in the system of FIG. 1.
Figure 3:
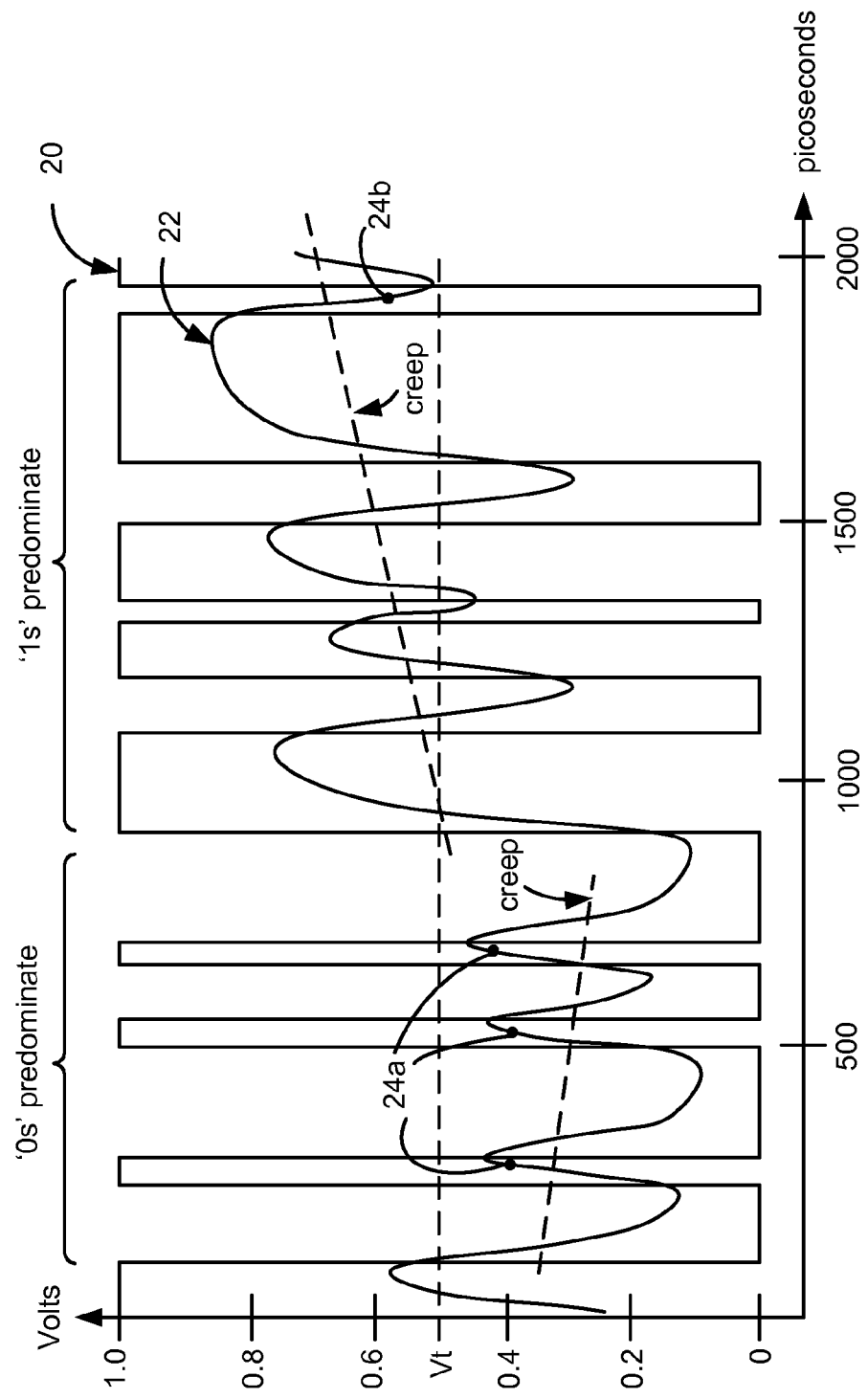
FIG. 3 illustrates the phenomenon of intersymbol interference (ISI) and DC creep that occur when digital data is passed through a bandwidth-limited channel.

As can be seen, the encoded data bits can comprise one of three data states: a logic '−1', a logic '0', and a logic '+1.' As with other tri-level encoding techniques (see, e.g., Bi-RZ in FIG. 2), the voltages corresponding to these logic states may comprise −Vcc, GND, and +Vcc. However, this is relative, and instead the logic states '−1,' '0,' and '+1' can respectively comprise GND, +½Vcc, and +Vcc should an all-positive-voltage implementation be desired, which logic states could be referred to as '0,' '½,' and '1' (or '0,' '1,' and '2') if desired. Ultimately, the actual voltage levels used for the three logic states are not important, so long as they are distinct and symmetric about the midpoint voltage level.

Figure 4B:
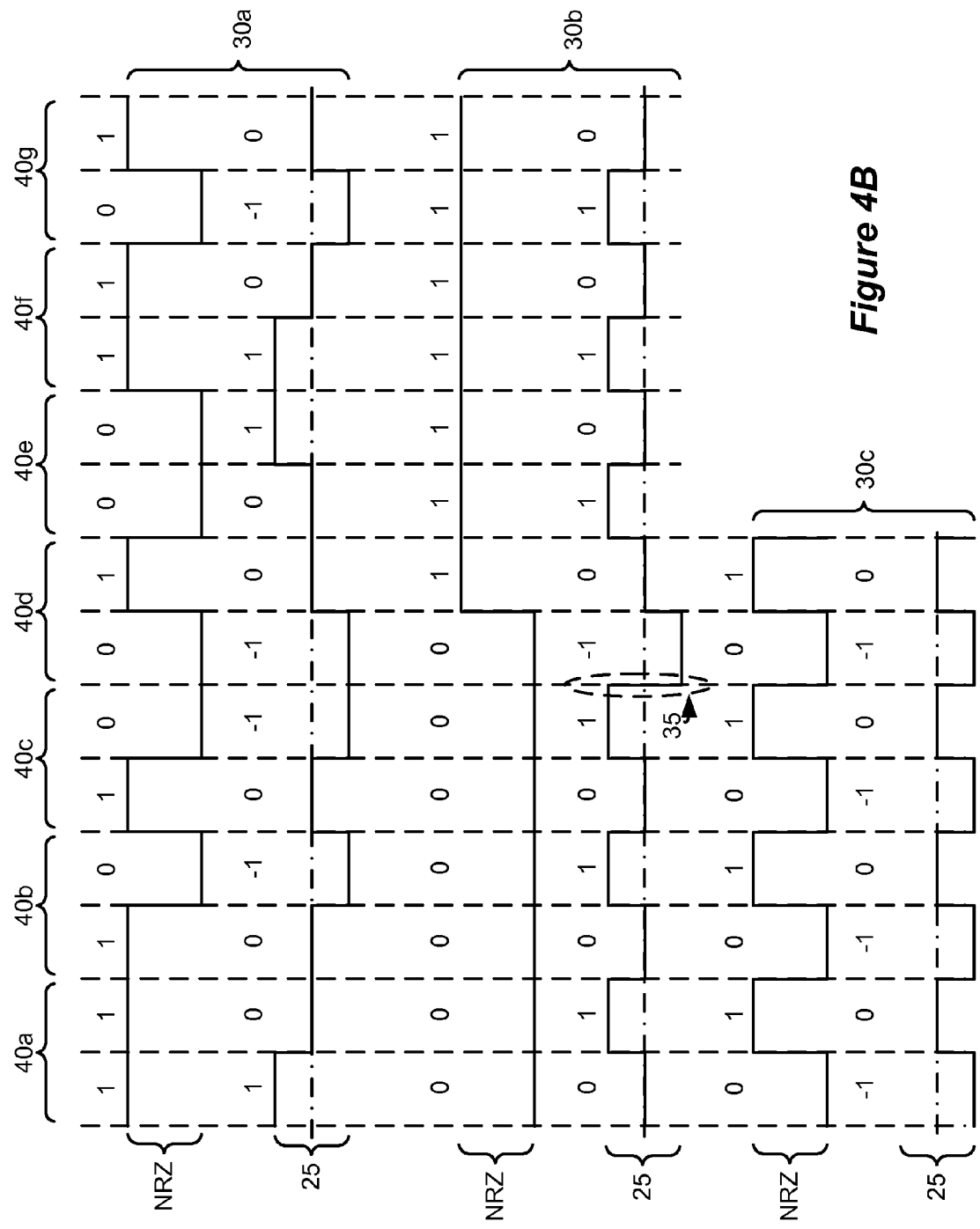
FIG. 4B illustrates how the encoding scheme is implemented using various example signals.

Examples of the encoding provided by this improved scheme 25 are shown in three examples 30a, 30b, and 30c of FIG. 4B. Example 30a shows encoding according to the new technique of the same exemplary normal NRZ signal illustrated in FIG. 2. From this example 30a, several points concerning the disclosed encoding technique may be identified.

First, encoding occurs individually on each group 40a-40g of two consecutive original bits. The encoding likewise renders two bits of the same duration (frequency) as the original bits. This is significant because, as noted earlier, encoding techniques that increase the frequency of the encoded/transmitted signal (such as the RZ and Bi-RZ approaches of FIG. 2) are not preferred when a primary goal of encoding is to mitigate the effects of ISI and DC creep.

Second, each original two bits, when encoded, are guaranteed to transition, a point easily verified via review of FIG. 4A. If the two original bits in a group 40 comprises the same logic state ('0' and '0'; or '1' and '1'), the encoded bits will comprise a transition between '0' and '+1.' If the two original bits comprise different logic states ('0' and '1'; or '1' and '0'), the encoded bits will comprise a transition between '−1' and '0.' As a result, even if a particular logic state predominate in the original stream of data bits, such as is shown in example 30b, the encoded bits are guaranteed to transition, which protects against DC creep. Likewise, if the original data bits involve cyclic transitions (e.g., as would a clock signal), such as is shown in example 30c, the encoded bits will again transition between data states. To be more precise concerning the guaranteed nature of the transitions in the disclosed encoding technique 25, studying the encoding chart of FIG. 4A reveals that a particular data state cannot occur more than twice in a row in the resulting encoded bit stream. Because data state transitions are guaranteed in the resulting encoded signal, problems with DC creep are alleviated. To be more quantitatively accurate, DC bias shifting is constrained to +/−25% around the midpoint voltage chosen for the encoded signal, which boundaries are established by the worst-case examples 30b (possible +25% DC bias shift) and 30c (possible −25% bias shift) of FIG. 4B. For truly random original data, the DC bias should naturally constrain to the midpoint voltage.

Third, as a trade off, the disclosed encoding technique 25 employs three logic states or voltage levels. As will be seen below in FIG. 5B, this requires two threshold voltages for sensing, which will reduce sensing margin.

Fourth, notice from FIG. 4A that the prescribed encoding transition between bits within a group 40 only swings through half of the full resulting signal voltage, i.e., between '0' and '+1' or between '0' and '−1.' Moreover, only two out of a possible sixteen inter-group transitions will result in full voltage swings 35 (see example 30b of FIG. 4B) between two consecutive encoded groups: '0001,' which results in a '+1' to '−1' swing; and '1011,' which results in a '−1' to '+1' swing. This means that there is only a 1-in-8 chance that consecutive two-bit groups 40 will require a full swing 35 in the resulting data signal. Because most bit-to-bit transitions will not require a full voltage swing in accordance with the disclosed technique 25, the disclosed technique will not require as much power to drive the encoded signals onto the channel 16.

Figure 5A:
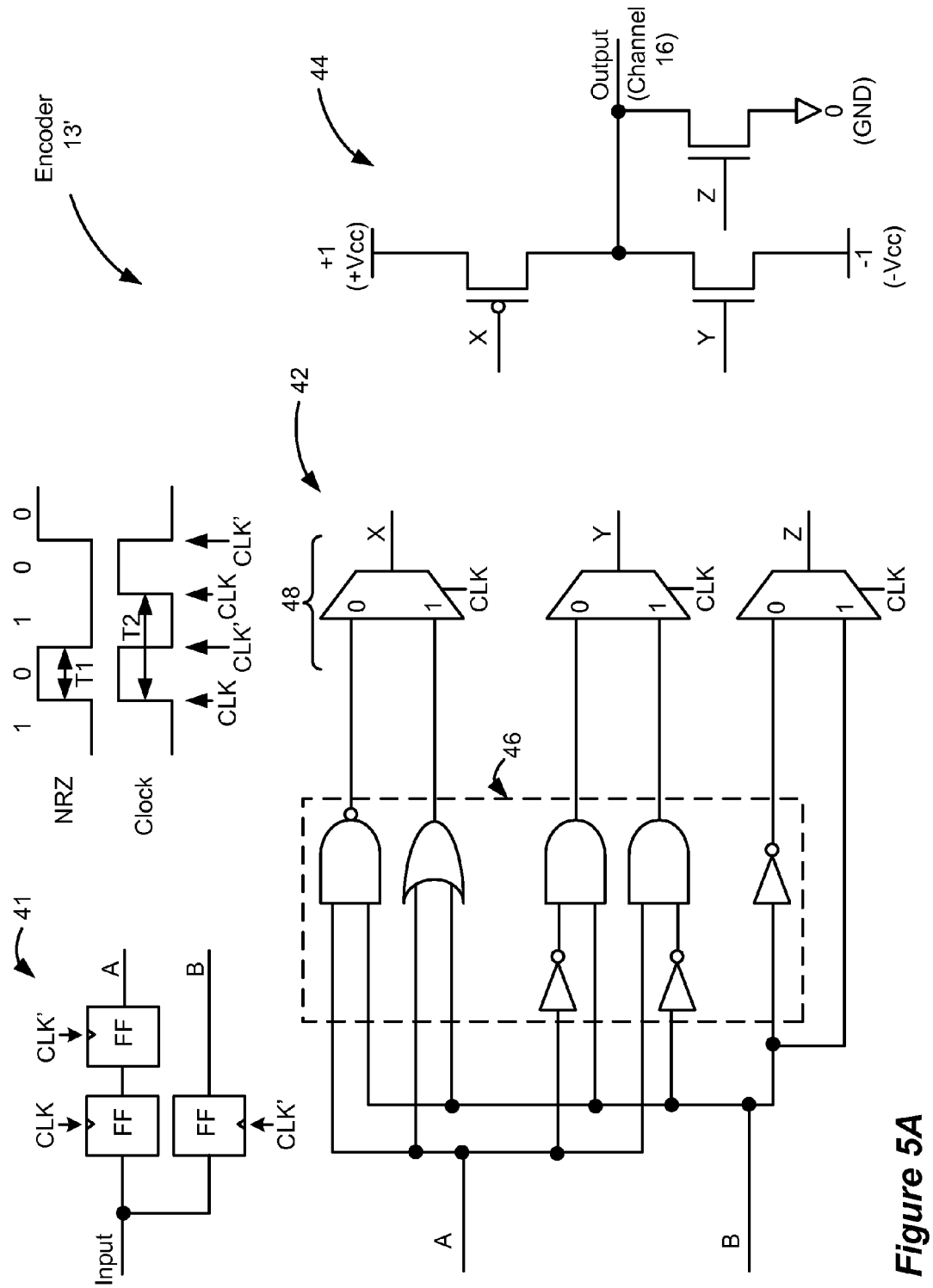
FIGS. 5A and 5B respectively illustrate the encoder and decoder useable in the transmitter and receiver for implementing the disclosed encoding scheme.
Figure 5B:
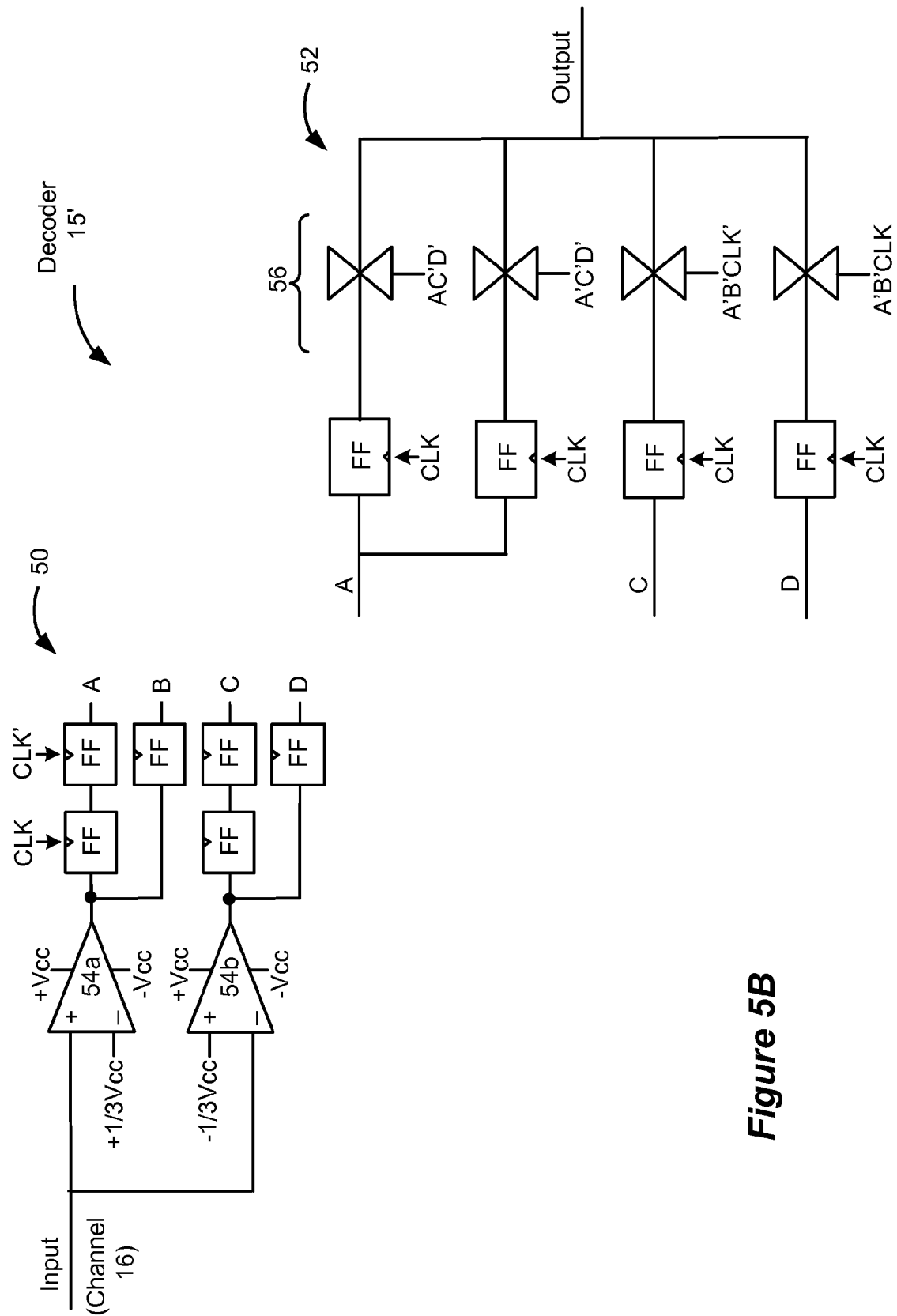

FIGS. 5A and 5B illustrate circuitry that can be used to implement the disclosed encoding technique 25, and respectively show an encoder 13' useable in the transmitter 12 and a decoder 15' useable in the receiver 14. Both the encoder 13' and the decoder 15' operate in conjunction with a clock, whose period (T2) is twice that of the duration of any bit (T1) in the NRZ data to be encoded, as shown in FIG. 5A. Therefore, to handle the data in appropriate groups 40 of two bits, certain actions within the encoder 13' and decoder 15' preferably take place on both the rising edge (CLK) and falling edge (CLK') of the clock. While FIGS. 5A and 5B illustrate examples of encoders/decoders for use in implementing the disclosed encoding technique 25, it should be noted that other encoder/decoder circuits could also be used.

Because operation of the encoder 13' and the decoder 15' of FIGS. 5A and 5B should be self-explanatory to those of skill in the art, they are only briefly discussed. The encoder 13' of FIG. 5A can be understood as comprising three stages: a group formation stage 41, an encoding stage 42, and a driver stage 44. The group formation stage 41 essentially takes the NRZ data bits at its input and creates a group of two original bits, A and B, which both pass via flip flops (FF) to the encoding stage 42 on the negative clock transition, CLK'. Once there, the encoding stage 42 passes signals A and B to a series of logic gates 46. Because the operation of logic gates 46 (NOT, AND, NAND, and OR gates) is well understood by those skilled in the art, the details of how they process signals A and B to arrive at the inputs to the multiplexers 48 is not belabored here.

The multiplexers 48 pass their upper inputs while the clock is low (CLK'), and pass their lower inputs when the clock is high (CLK), to form driver control signals X, Y, and Z. Like the original data signals, signals X, Y, and Z have durations equal to T1, i.e., half the clock period T2. Driver control signals X, Y, and Z respectively enable the driver stage 44 to output either a '+1' (+Vcc), '−1' (−Vcc) or a '0' (GND) onto the transmission channel 16. When the logic gates 46 are chosen appropriately as illustrated in FIG. 5A, only one of each driver control signal X, Y, or Z will enable its associated transistor in the driver stage at any given time to ensure no conflict between the three data states. In summary, the overall effect of the encoder 13' will be to transform each group 40 of two consecutive NRZ bits into two consecutive encoded bits, and to drive those encoded bits onto the data channel 16, thus implementing the encoding scheme of FIG. 4A.

As noted above, the decoder 15' within the receiver 14 is illustrated in FIG. 5B. The decoder 15' comprises a sensing stage 50 and a decoding stage 52'. The sensing stage 50 receives the encoded data as sent from the transmitter 12 via the channel 16, and sends such data to two operational amplifiers ("op amps") 54a and 54b. The op amps 54a and 54b employ two reference voltages of magnitudes logically chosen to assist in sensing the three logic levels potentially present on the channel 16. The top operational amplifier 54a has a reference voltage of +⅓Vcc, and thus will output a '1' when a logic '1' (+Vcc) is present on the channel 16; else, op amp 54a outputs a '−−1.' The bottom operational amplifier 54b has a reference voltage of −⅓Vcc, and thus will output a '1' when a logic '−1' (−Vcc) is present on the channel 16; else, op amp 54b outputs a '−1.' If a logic '0' (GND) is present on the channel, neither op amp 54a nor 54b will output a '1,' an instead both will output a '−1.' These asserted outputs from the op amps are captured for each of the two encoded bits in a group 40, with signals A and C essentially reflecting the first bit in the group (as captured on CLK), and signal B and D reflecting the second bit in the group (as captured on CLK').

Figure 1:
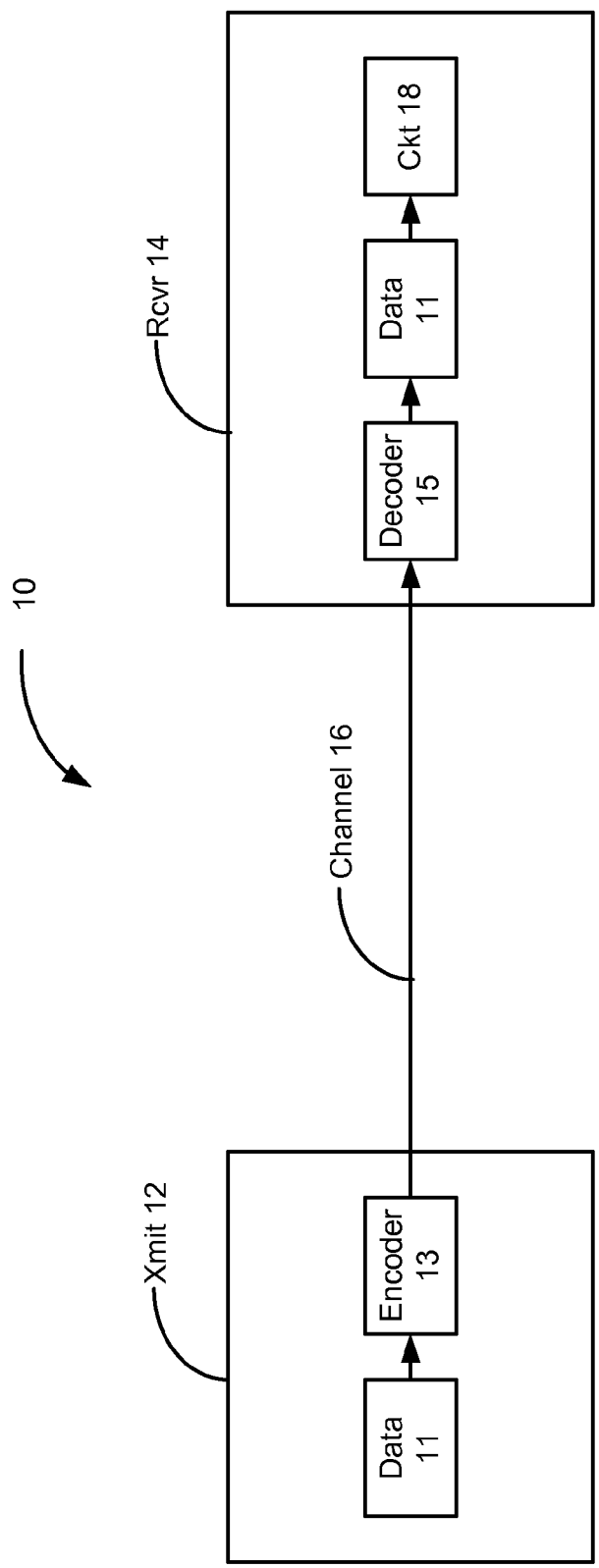
FIG. 1 illustrates a basic transmitter/receiver system for digital data, including an encoder in the transmitter and a decoder in the receiver.

The decoding stage 52 receives signals A, B, C, and D and decodes them to reconstitute the original NRZ signals, and essentially comprises logic to perform the opposite of the transformation depicted in FIG. 4A. In this regard, transmission gates 56 are used to pass decoded values of A, C, and D to the decoded output. The transmission gates are enabled by various logical constructs of the A, B, C, D, and clock signals. (The actual logic gates used to create the logical constructs are not shown, because such mundane details are well known to those of skill in the art). For example, the ANDed value of A, C' (the complement of C), and D' will allow the first transmission gate 56 to pass its input (A) to the decoder output. In other words, when A=1, C=0, and D=0, A will be asserted as the output. Because of the particular logic configuration chosen, it turns out that only one of the top two transmission gates 56 will be asserted during CLK, while only one of the bottom two transmission gates will be asserted during CLK'. While one skilled in the art can readily work out the logic employed in FIG. 5B, the result is that the output of the decoding stage 52 comprises the reconstituted original bits, which after decoding may be used by appropriate functional circuit 18 in the receiver 14 (see FIG. 1). Note that these original bits are derived by the decoding stage 52 one clock cycle after their encoded counterparts are received at the sensing stage 50.

As shown, the decoding stage 52 of the decoder operates with signals of +Vcc ('+1') and −Vcc ('−1'). Therefore, the output of the decoding stage 52 is likewise of the same binary voltage levels. Realizing that functional circuit 18 and other circuitry in the receiver may not operate at such voltage levels, but instead may operate at traditional +Vcc and GND levels, the decoding stage 52 output may first require passage through a level shifter. However, an appropriate level shifter is not shown in FIG. 5B because it would not be required in all useful embodiments, and because level shifters are commonplace and do not require disclosure here. For example, if the three levels chosen for the encoded bits comprise GND ('−1'), +½Vcc ('0'), and +Vcc ('+1'), no level shifter would be necessary prior to transmission of the decoded data to the functional circuit 18.

FIG. 6A shows another embodiment of the encoding technique 25' in which the two encoded bits in each group are reversed when compared to the technique 25 of FIG. 4A. FIG. 6B shows yet another embodiment of the encoding technique 25" in which the polarity of the encoded bits is changed when compared to the technique 25 of FIG. 4A. Thus, in FIG. 6B, identical original bits ('0 0'; '1 1') work a transition between '0' and '−1,' while different original bits '0 1'; '1 0') work a transition between '0' and '+1.' FIG. 6C shows yet another embodiment of the encoding technique 25''', in which the two encoded bits in each group are reversed when compared to technique 25" of FIG. 6B. While obviously requiring different but easily-derivable encoder and decoder circuits, the encoding techniques 25', 25", and 25''' will otherwise achieve the same performance benefits of the technique 25 discussed earlier, and further illustrate that the basic invention can be embodied in different manners.

As referred to herein, "first," "second," and "third logic levels" do not imply magnitude or order of the logic levels, and instead comprise general labels for the logic levels.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method for encoding a sequence of data bits, comprising:
    providing two original consecutive bits from the sequence of data bits, wherein each of the two original consecutive bits has one of two potential logic levels, and wherein each of the two original consecutive bits has a duration;
    converting the two original consecutive bits into two encoded consecutive bits by assessing the logic levels of the original consecutive bits, wherein if the two original consecutive bits are of the same level then the two encoded consecutive bits comprise a first and second of three potential logic levels, and if the two original consecutive bits are not of the same level then the two encoded consecutive bits comprise the second and a third of the three potential logic levels, wherein the second logic level is between the first and third logic levels, and wherein each of the two encoded consecutive bits has the duration; and
    repeating the foregoing steps for a next two original consecutive bits from the sequence of data bits.

2. The method of claim 1, wherein the three potential logic levels for the encoded consecutive bits comprise a negative power supply voltage, a ground voltage, and a positive power supply voltage.

3. The method of claim 1, wherein the three potential logic levels for the encoded consecutive bits comprise ground, a first positive voltage, and a second positive voltage greater than the first positive voltage.

4. The method of claim 3, wherein the first positive voltage comprises one-half a power supply voltage, and wherein the second positive voltage comprises the power supply voltage.

5. The method of claim 1,
    wherein if the two original consecutive bits comprises two logic '0's then the two encoded consecutive bits comprise the first logic level followed by the second logic level,
    wherein if the two original consecutive bits comprise two logic '1's then the two encoded consecutive bits comprise the second logic level followed by the first logic level,
    wherein if the two original consecutive bits comprises a logic '0' followed by a logic '1' then the two encoded consecutive bits comprise the second logic level followed by the third logic level, and
    wherein if the two original consecutive bits comprise a logic '1' followed by a logic '0' then the two encoded consecutive bits comprise the third logic level followed by the second logic level.

6. The method of claim 1,
    wherein if the two original consecutive bits comprises two logic '0's then the two encoded consecutive bits comprise the second logic level followed by the first logic level,
    wherein if the two original consecutive bits comprise two logic '1's then the two encoded consecutive bits comprise the first logic level followed by the second logic level,
    wherein if the two original consecutive bits comprises a logic '0' followed by a logic '1' then the two encoded consecutive bits comprise the third logic level followed by the second logic level, and
    wherein if the two original consecutive bits comprise a logic '1' followed by a logic '0' then the two encoded consecutive bits comprise the second logic level followed by the third logic level.

7. The method of claim 1, wherein the second logic level is a midpoint voltage level between the first and third logic levels.

8. A method for transmitting data from a transmitter to a receiver via a channel, comprising:
    providing two original consecutive bits from a sequence of data bits in the transmitter, wherein each of the two original consecutive bits has one of two potential logic levels, and wherein each of the two original consecutive bits has a duration;
    converting in the transmitter the two original consecutive bits into two encoded consecutive bits by assessing the logic levels of the original consecutive bits, wherein if the two original consecutive bits are of the same level then the two encoded consecutive bits comprise a first and second of three potential logic levels, and if the two original consecutive bits are not of the same level then the two encoded consecutive bits comprise the second and a third of the three potential logic levels, wherein the second logic level is between the first and third logic levels, and wherein each of the two encoded consecutive bits has the duration;
    transmitting the two encoded consecutive bits through the channel to the receiver;
    receiving the two encoded consecutive bits at the receiver;
    decoding in the receiver the two encoded consecutive bits to reconstitute the two original consecutive bits; and
    repeating the foregoing steps for a next two original consecutive bits from the sequence of data bits.

9. The method of claim 8, wherein the three potential logic levels for the encoded consecutive bits comprise a negative power supply voltage, a ground voltage, and a positive power supply voltage.

10. The method of claim 8, wherein the three potential logic levels for the encoded consecutive bits comprise ground, a first positive voltage, and a second positive voltage greater than the first positive voltage.

11. The method of claim 10, wherein the first positive voltage comprises one-half a power supply voltage, and wherein the second positive voltage comprises the power supply voltage.

12. The method of claim 8,
    wherein if the two original consecutive bits comprises two logic '0's then the two encoded consecutive bits comprise the first logic level followed by the second logic level,
    wherein if the two original consecutive bits comprise two logic '1's then the two encoded consecutive bits comprise the second logic level followed by the first logic level, wherein if the two original consecutive bits comprises a logic '0' followed by a logic '1' then the two encoded consecutive bits comprise the second logic level followed by the third logic level, and wherein if the two original consecutive bits comprise a logic '1' followed by a logic '0' then the two encoded consecutive bits comprise the third logic level followed by the second logic level.

13. The method of claim 8, wherein if the two original consecutive bits comprises two logic '0's then the two encoded consecutive bits comprise the second logic level followed by the first logic level, wherein if the two original consecutive bits comprise two logic '1's then the two encoded consecutive bits comprise the first logic level followed by the second logic level, wherein if the two original consecutive bits comprises a logic '0' followed by a logic '1' then the two encoded consecutive bits comprise the third logic level followed by the second logic level, and wherein if the two original consecutive bits comprise a logic '1' followed by a logic '0' then the two encoded consecutive bits comprise the second logic level followed by the third logic level.

14. The method of claim 8, wherein the second logic level is a midpoint voltage level between the first and third logic levels.

15. The method of claim 8, wherein either the transmitter or receiver comprises a synchronous dynamic random access memory.

16. A transmitter, comprising:

an encoder, wherein the encoder is adapted to continually take a next of two original consecutive bits from a sequence of data bits, wherein each of the two original consecutive bits has a duration, and wherein the encoder is adapted to convert the two original consecutive bits into two encoded consecutive bits, wherein if the two original consecutive bits are of the same level then the two encoded consecutive bits comprise a first and second of three potential logic levels, and if the two original consecutive bits are not of the same level then the two encoded consecutive bits comprise the second and a third of the three potential logic levels, wherein the second logic level is between the first and third logic levels, and wherein each of the two encoded consecutive bits has the duration, and wherein the continuous operation of the encoder produces a sequence of encoded bits.

17. The transmitter of claim 16, wherein the three potential logic levels for the encoded consecutive bits comprise a negative power supply voltage, a ground voltage, and a positive power supply voltage.

18. The transmitter of claim 16, wherein the three potential logic levels for the encoded consecutive bits comprise ground, a first positive voltage, and a second positive voltage greater than the first positive voltage.

19. The transmitter of claim 18, wherein the first positive voltage comprises one-half a power supply voltage, and wherein the second positive voltage comprises the power supply voltage.

20. The transmitter of claim 16, wherein the transmitter is adapted to operate with a clock with a period of twice the duration.

21. The transmitter of claim 16, wherein the encoder comprises a group formation stage for capturing the next of two original consecutive bits, wherein the group formation stage is coupled to an encoding stage, and wherein the encoding stage is coupled to a driving stage for providing the sequence of encoded bits to a transmission channel.

22. The transmitter of claim 16, wherein if the two original consecutive bits comprises two logic '0's then the two encoded consecutive bits comprise the first logic level followed by the second logic level, wherein if the two original consecutive bits comprise two logic '1's then the two encoded consecutive bits comprise the second logic level followed by the first logic level, wherein if the two original consecutive bits comprises a logic '0' followed by a logic '1' then the two encoded consecutive bits comprise the second logic level followed by the third logic level, and wherein if the two original consecutive bits comprise a logic '1' followed by a logic '0' then the two encoded consecutive bits comprise the third logic level followed by the second logic level.

23. The transmitter of claim 16, wherein if the two original consecutive bits comprises two logic '0's then the two encoded consecutive bits comprise the second logic level followed by the first logic level, wherein if the two original consecutive bits comprise two logic '1's then the two encoded consecutive bits comprise the first logic level followed by the second logic level, wherein if the two original consecutive bits comprises a logic '0' followed by a logic '1' then the two encoded consecutive bits comprise the third logic level followed by the second logic level, and wherein if the two original consecutive bits comprise a logic '1' followed by a logic '0' then the two encoded consecutive bits comprise the second logic level followed by the third logic level.

24. The transmitter of claim 16, wherein the second logic level is a midpoint voltage level between the first and third logic levels.

* * * * *